(12) United States Patent
Jindo

(10) Patent No.: US 11,508,561 B2
(45) Date of Patent: Nov. 22, 2022

(54) PLASMA PROCESSOR

(71) Applicant: FUJI CORPORATION, Chiryu (JP)

(72) Inventor: Takahiro Jindo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 130 days.

(21) Appl. No.: 17/052,690

(22) PCT Filed: May 23, 2018

(86) PCT No.: PCT/JP2018/019827
§ 371 (c)(1),
(2) Date: Nov. 3, 2020

(87) PCT Pub. No.: WO2019/224937
PCT Pub. Date: Nov. 28, 2019

(65) Prior Publication Data
US 2021/0183630 A1    Jun. 17, 2021

(51) Int. Cl.
*H01J 37/32* (2006.01)
*H01J 37/244* (2006.01)

(52) U.S. Cl.
CPC ...... *H01J 37/32816* (2013.01); *H01J 37/244* (2013.01); *H01J 37/32449* (2013.01); *H01J 37/32944* (2013.01)

(58) Field of Classification Search
CPC ........... H01J 37/32357; H01J 37/32449; H01J 37/32816; H01J 37/32944; H05H 1/3494; H05H 1/4645
See application file for complete search history.

(56) References Cited

U.S. PATENT DOCUMENTS

| 4,663,515 A | 5/1987 | Kneeland |
| 6,420,672 B1 | 7/2002 | Ulrich et al. |
| 2006/0186094 A1* | 8/2006 | Krink ...................... H05H 1/36 219/121.55 |
| 2015/0069911 A1* | 3/2015 | Nettesheim ....... H01J 37/32357 315/111.21 |
| 2017/0001255 A1 | 1/2017 | Winn |
| 2017/0239730 A1* | 8/2017 | Shirakawa ............... B22F 5/12 |
| 2019/0080935 A1* | 3/2019 | Ohashi ............... H01L 21/3065 |
| 2019/0090340 A1* | 3/2019 | White ...................... H05H 1/34 |
| 2019/0157049 A1* | 5/2019 | Sato .................. H01L 21/02274 |
| 2019/0184187 A1* | 6/2019 | Lee .......................... A61N 1/08 |

FOREIGN PATENT DOCUMENTS

JP    2012-129356 A    7/2012

OTHER PUBLICATIONS

International Search Report dated Aug. 7, 2018 in PCT/JP2018/019827 filed May 23, 2018.

* cited by examiner

*Primary Examiner* — Tung X Le
(74) *Attorney, Agent, or Firm* — Oblon, McClelland, Maier & Neustadt, L.L.P.

(57) ABSTRACT

A plasma processing apparatus, for releasing plasma-converted gas from plasma head for performing process, detects the pressures of a gas prior to application of a voltage to electrodes of the plasma head, the gas being supplied from gas supply section to a plasma head, and allow initiation of process by the plasma processing apparatus based on the detected pressures.

7 Claims, 6 Drawing Sheets

PLASMA PROCESSOR

TECHNICAL FIELD

The present application relates to a plasma processing apparatus for performing process with a plasma-converted gas.

BACKGROUND ART

A plasma processing apparatus, for example, as described in the following Patent Literature, includes a plasma head for discharging a plasma-converted gas, which is a gas that has been converted to plasma, and is configured to discharge the plasma-converted gas over the surface of a workpiece. A reaction gas, serving as an original form of the plasma-converted gas, and a carrier gas for carrying the reaction gas are supplied from a gas supply device to the plasma head. The plasma head includes a pair of electrodes, and a voltage is applied between the electrodes to convert the reaction gas passing between the electrodes to plasma. The plasma-converted gas and carrier gas are discharged from a nozzle of the plasma head.

PATENT LITERATURE

Patent Literature 1: JP-A-2012-129356

BRIEF SUMMARY

Technical Problem

The above-mentioned plasma processing apparatus is under development, and it is possible to improve the practicality of the plasma processing apparatus by making some improvements. It is an object of the present disclosure to provide a highly practical plasma discharge device.

Solution to Problem

In order to solve the above-mentioned problem, the plasma processing apparatus of the present disclosure is configured to perform process using a plasma-converted gas and comprises: a plasma head configured to convert gas into plasma between electrodes to which a voltage is applied and discharge the plasma-converted gas from a nozzle; a gas supply device configured to supply gas including gas to be converted into plasma to the plasma head; a pressure detector configured to detect the pressure of the gas supplied from the gas supply device; and a controller configured to control the plasma processing apparatus, wherein the controller is configured to allow initiation of process based on a voltage post-application gas pressure, which is the gas pressure detected by the pressure detector after starting voltage application to the electrodes. Incidentally, the "gas to be converted to plasma", that is, the "gas supplied from the gas supply device" is a concept including not only the gas to be converted to plasma (reaction gas) but also other gases such as a carrier gas, as will be described later.

Advantageous Effects

In the plasma processing apparatus of the present disclosure, it is possible to easily determine whether the plasma processing apparatus can perform an appropriate process based on the gas pressure after starting voltage application to the electrodes, and the initiation of process is allowed based on the determination, thereby ensuring an appropriate process.

DESCRIPTION OF EMBODIMENTS

Hereinafter, a typical embodiment of the plasma processing apparatus of the present disclosure will be described in detail with reference to the drawings as an example of a plasma processing apparatus. In addition to the following embodiments, the present disclosure can be executed in various modes in which various modifications and improvements have been implemented based on the knowledge of those skilled in the art.

EMBODIMENTS

[A] Overall Configuration of the Plasma Processing Apparatus

Figure 1:
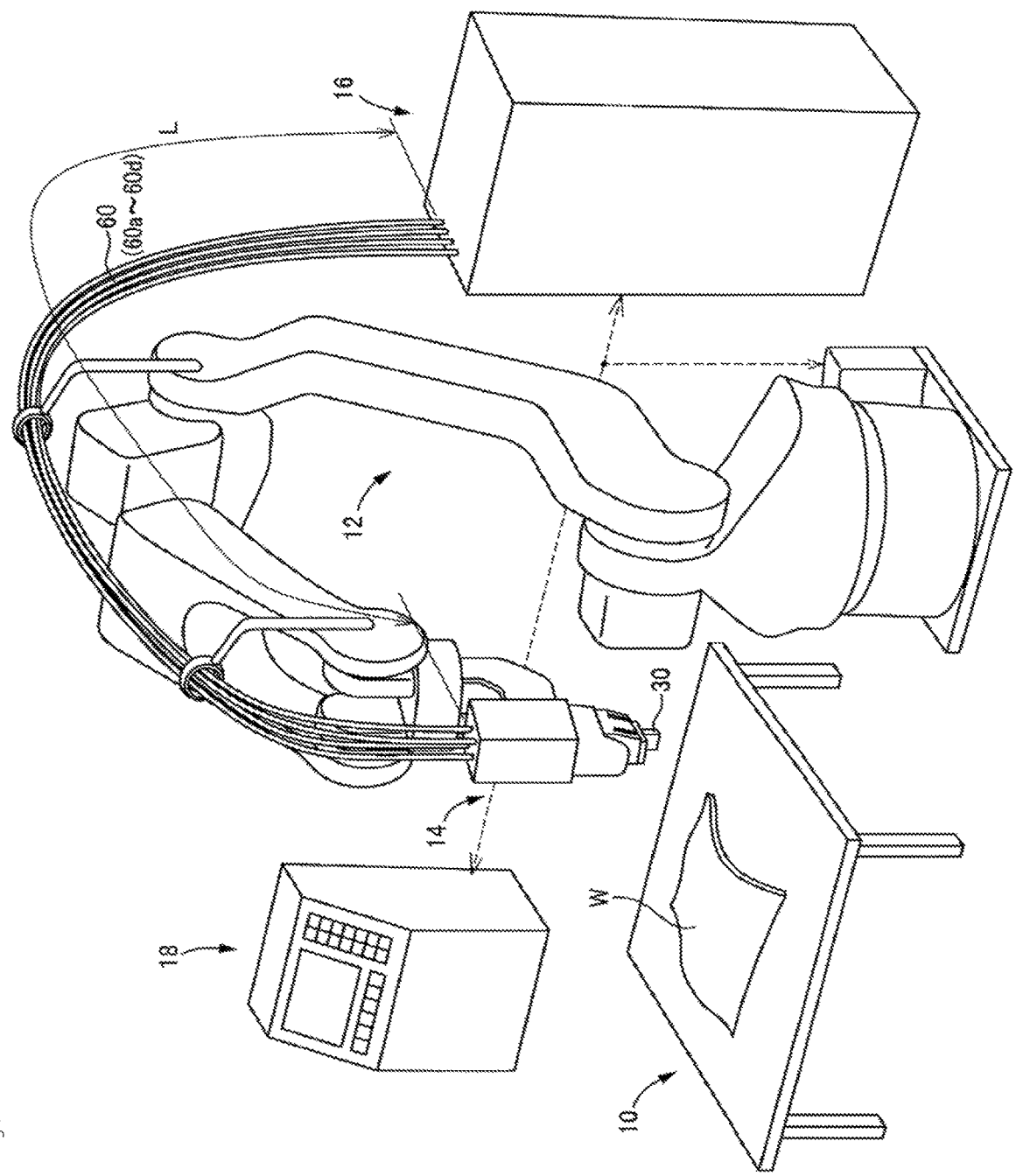
FIG. 1 A perspective view showing an overall configuration of a plasma processing apparatus of the embodiment.

The plasma processing apparatus of the embodiment, as shown in FIG. 1, is configured to include table 10 on which workpiece W is placed; a serial-link type robot (may be referred to as "multi-articulated robot", but hereinafter referred to simply as "robot") 12 disposed adjacent to table 10; plasma head 14 (hereinafter, may simply be referred to as "head 14"), held by robot 12, for discharging plasma-converted gas; power supply and gas supply unit 16, which is a power supply to head 14 and supplies gas to head 14; and controller 18 (with a computer as a main component) as a control device for controlling the plasma processing apparatus. Incidentally, robot 12 functions as a head moving device for moving head 14 for discharging plasma-converted gas to the workpiece.

Figure 2:
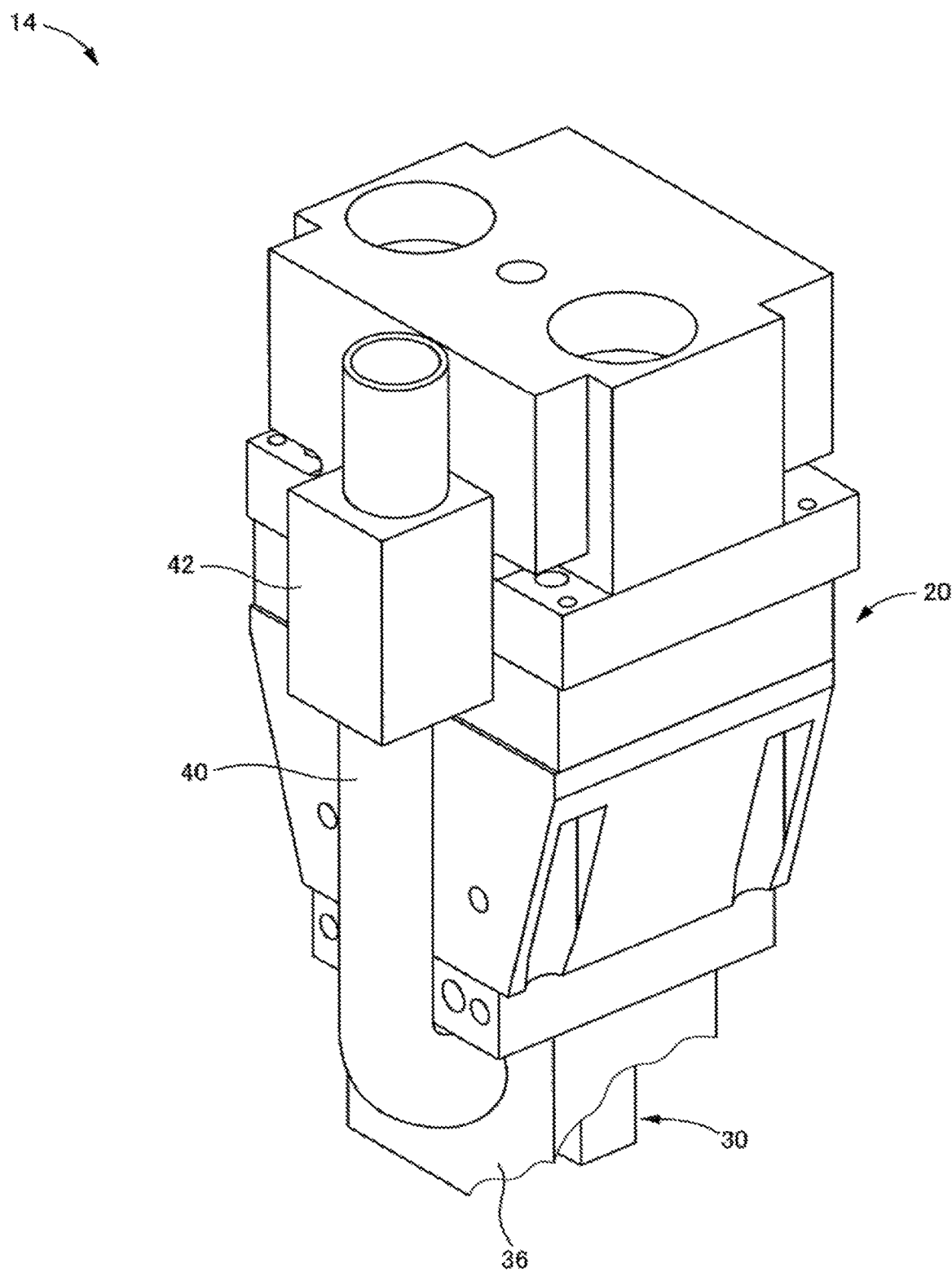
FIG. 2 A perspective view showing a state of the discharge head, serving as a plasma head of the plasma processing apparatus of FIG. 1, in which the cover is removed.
Figure 3:
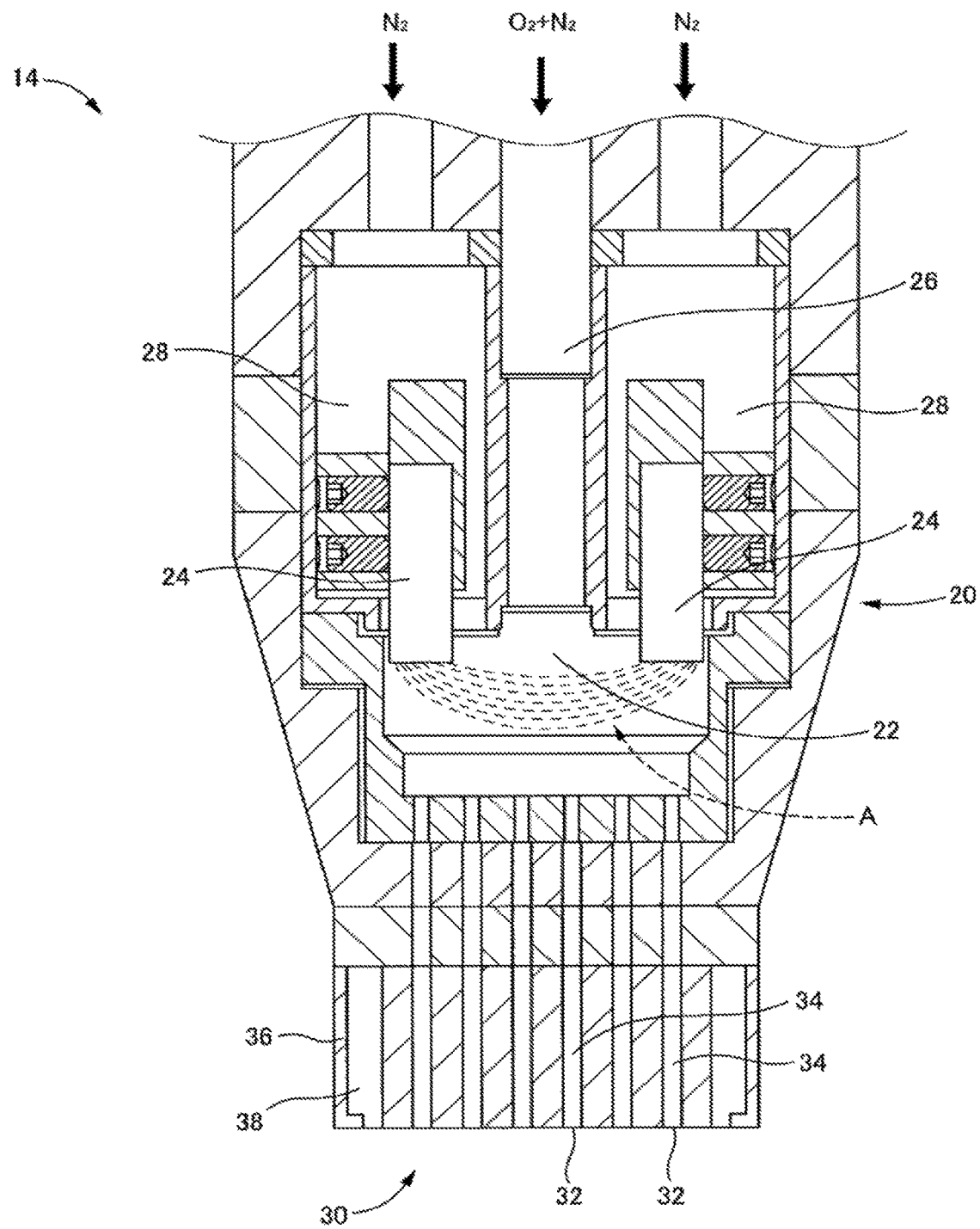
FIG. 3 A sectional view of the discharge head of FIG. 2.

Referring to FIG. 2, which shows a state in which the cover is removed, and FIG. 3, which is a sectional view, head 14 has housing 20, generally made of ceramic, and within housing 20, reaction chamber 22 for generating plasma-converted gas is formed. A pair of electrodes 24 is then held so as to protrude into reaction chamber 22 Reaction gas flow path 26 for allowing a reaction gas to flow into reaction chamber 22 from above and a pair of carrier gas flow paths 28 for allowing carrier gas to flow in are formed in housing 20. The reaction gas (seed gas) is oxygen ($O_2$), but from reaction gas flow path 26, a mixed gas of oxygen and nitrogen ($N_2$) (e.g., dry air (Air)) is allowed to flow between electrodes 24 (hereinafter, this mixed gas is also referred to as "reaction gas" for convenience, and oxygen may be referred to as "seed gas"). The carrier gas is nitrogen and is allowed to flow in from each carrier gas flow path 28 so as to surround the respective electrodes 24. Nozzle 30 forms the lower portion of head 14, and nozzle 30 has multiple discharge ports 32 aligned in a row. Multiple discharge paths 34 are formed downward from reaction chamber 22 to connect to respective discharge ports 32.

The power supply of power supply and gas supply unit 16 applies an alternating current voltage between the pair of electrodes 24. Due to this voltage application, for example, as shown in FIG. 3, pseudo arc A is generated between the lower ends of the pair of electrodes 24 in reaction chamber 22. When the reaction gas passes through pseudo arc A, the reaction gas is converted into plasma, and the plasma-converted gas, which is gas converted into plasma, is ejected from nozzle 30 together with carrier gas.

Incidentally, sleeve 36 is provided around nozzle 30 so as to surround nozzle 30. Heat gas (in the present plasma processing apparatus, air is used), as a shield gas, is supplied via supply pipe 40 to annular space 38 between sleeve 36 and nozzle 30, and the heat gas is released along the flow of the plasma-converted gas emitted from nozzle 30 so as to surround the plasma-converted gas. The heat gas, as the name implies, is discharged in a heated state to ensure the efficacy of the plasma-converted gas. Therefore, heater 42 for heating is provided partway along the length of supply pipe 40.

Power supply and gas supply unit 16 is configured to include a power supply section and a gas supply section. The power supply section has a power supply for applying a voltage between the pair of electrodes 24 of head 14, and the gas supply section, functioning as a gas supply device, supplies the reaction gas, the carrier gas, and the shield gas mentioned above. The supplying of gas by the gas supply section will be described in detail below.

[B] Supply of Gases

Figure 4:
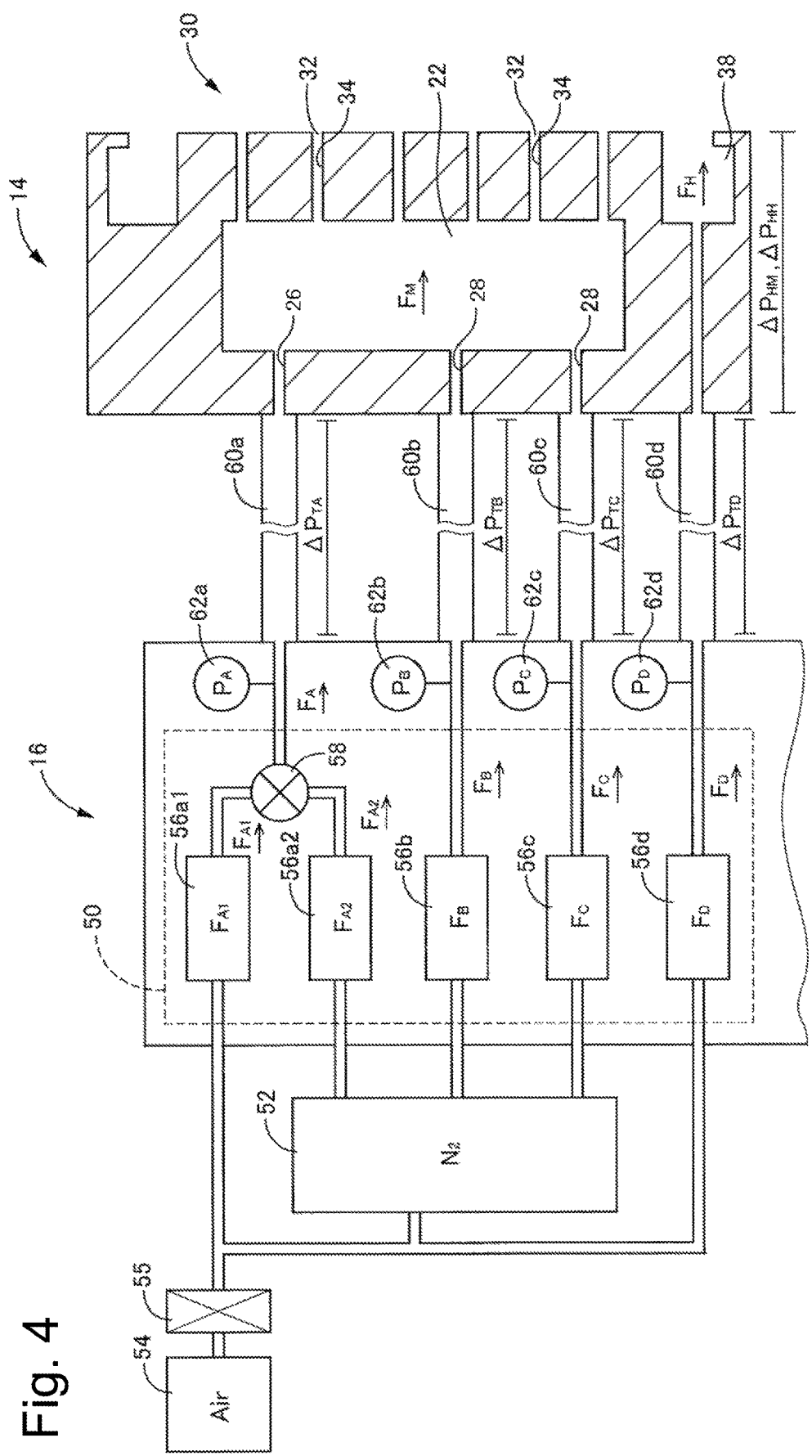
FIG. 4 A schematic diagram showing a configuration related to the supplying of gases to the plasma head in the plasma processing apparatus of FIG. 1.

As shown in FIG. 4, nitrogen gas and air are supplied to power supply and gas supply unit 16, specifically to gas supply section 50 of power supply and gas supply unit 16, from nitrogen gas generator 52 serving as a supply source of nitrogen gas ($N_2$) and compressor 54 serving as a supply source of air (e.g., dry air). Incidentally, nitrogen gas generator 52 is configured to separate nitrogen gas from air supplied from compressor 54, and dryer 55 to remove moisture from the air supplied from compressor 54 is provided.

Gas supply section 50 has mass flow controllers 56, each functioning as a flow rate controller, which are provided individually for controlling: air containing oxygen as a seed gas constituting the above-mentioned reaction gas; nitrogen gas ($N_2$) which also constitutes the reaction gas; nitrogen gas ($N_2$) as two carrier gas systems corresponding to the pair of carrier gas flow paths 28 of head 14; and air to be heat gas. For convenience, mass flow controllers 56 may be referred to as mass flow controllers 56a1, 56a2, 56b to 56d if each of the five mass flow controllers needs to be distinguished. Air whose flow rate is controlled by mass flow controller 56a1 and nitrogen gas whose flow rate is controlled by mass flow controller 56a2 are mixed together by mixer 58 to generate reaction gas (N2+O2).

The reaction gas, the two carrier gas systems, and the heat gas are supplied to head 14, respectively, via four gas tubes 60 (refer also to FIG. 1). Incidentally, hereinafter, gas tubes 60 may be referred to simply as "tubes 60", and if the four gas tubes 60 need to be distinguished from one another for a detailed description, tubes 60 may be referred to individually as tubes 60a to 60d. The reaction gas and the two carrier gas systems supplied through tubes 60a to 60c are mixed in reaction chamber 22 in head 14, and the mixed gas containing the plasma-converted oxygen is discharged from nozzle 30. Pressure sensors 62, which are pressure detectors, are provided at the ends of four tubes 60 which interface with corresponding mass flow controllers 56 inside power supply and gas supply unit 16 to detect the pressures of the gases flowing into the four tubes 60. In other words, pressure sensor 62 is provided between each tube 60 and gas supply section 50. When it is necessary to distinguish each of the four pressure sensors 62, pressure sensors 62 are referred to as pressure sensor 62a to 62d. It can also be considered that mass flow controllers 56a1, 56a2 and mixer 58 constitute one gas supply device while mass flow controllers 56b to 56c individually constitute separate gas supply devices so as to correspond individually to tubes 60.

[C] Pressure of Gases Supplied to the Plasma Head and its Change

When the reaction gas, the two carrier gas systems, and the heat gas are supplied to head 14 via tubes 60, as can be seen from FIG. 4, pressure losses occur in each of tubes 60, and also in head 14, pressure losses occur in each of the lines of the carrier gas and the reaction gas (hereinafter, sometimes referred to as the "main gas system") and the line of the heat gas (hereinafter, sometimes referred to as the "heat gas system"). Assuming that the pressure loss in each tube 60a to 60d is the tube pressure loss $\Delta P_{TA}$ to $\Delta P_{TD}$, respectively, and the pressure loss in head 14 of the main gas system is the main gas system head pressure loss $\Delta P_{HM}$ and the pressure loss in head 14 of the heat gas system is the heat gas system head pressure loss $\Delta P_{HH}$, the actual pressures $P_A$ to $P_D$, which are the pressures of the gases to be detected by pressure sensors 62a to 62d, respectively, become:

$$P_A = \Delta P_{TA} \Delta P_{HM}$$

$$P_B = \Delta P_{TB} \Delta P_{HM}$$

$$P_C = \Delta P_{TC} \Delta P_{HM}$$

$$P_D = \Delta P_{TD} + \Delta P_{HH}.$$

If gas flow rates (mass flow rates per unit time) which are controlled by mass flow controllers 56a1, 56a2, 56b to 56d are $F_{A1}$, $F_{A2}$, $F_B$ to $F_D$, respectively, the gases flow in corresponding tubes 60a to 60d at flow rates of $F_A$ (=$F_{A1}$+$F_{A2}$) to $F_D$. Assuming that tube pressure losses $\Delta P_{TA}$ to $\Delta P_{TD}$ in individual tubes 60 in the cases of the gases flowing properly through corresponding tubes 60 are reference tube pressure losses $\Delta P_{TA0}$ to $\Delta P_{TD0}$ in accordance with the process, these reference tube pressure losses $\Delta P_{TA0}$ to $\Delta P_{TD0}$ are determined as below based on respective flow rates $F_A$ to $F_D$ of gases flowing through corresponding tubes 60 and tube length L of tubes 60 (respective lengths of tubes 60 can be considered to be equal to one another in the plasma processing apparatus of the present disclosure):

$$\Delta P_{TA0} = f_{TA}(F_A, L) = f_{TA}(F_{A1}+F_{A2}, L)$$

$$\Delta P_{TB0} = f_{TB}(F_B, L)$$

$$\Delta P_{TC0} = f_{TC}(F_C, L)$$

$$\Delta P_{TD0} = f_{TD}(F_D, L)$$

where $f_{TA}(\ )$~$f_{TD}(\ )$ are each functions with flow rates $F_A$ to $F_D$ and tube length L as parameters.

Assuming that the main gas system head pressure loss $\Delta P_{HM}$ and the heat gas system head pressure loss $\Delta P_{HH}$, in a case of the gas flowing properly in head 14, are the reference main gas system head pressure loss $\Delta P_{HM0}$ and the reference heat gas system head pressure loss $\Delta P_{HH0}$, respectively, the reference main gas system head pressure loss $\Delta P_{HM0}$ and the reference heat gas system head pressure loss $\Delta P_{HH0}$ are given by the equation below based on the flow rates flowing through the main gas system and the heat gas system, that is, the main gas system flow rate $F_M$ (=$F_A$+$F_B$+$F_C$), the heat gas system flow rate $F_H$ (=$F_D$), and the head temperature T which is the temperature of head 14: $\Delta P_{HM0}=f_{HM}(F_M,T)=f_{HM}(F_A+F_B+F_C,T)=f_{HM}(F_{A1}+F_{A2}+F_B+F_C,T)$ $$\Delta P_{HH0}=f_{HH}(F_H,T)=f_{HH}(F_D,T)$$

where $f_{HM}(\ )$ and $f_{HH}(\ )$ are functions with flow rates $F_M$, $F_H$ and head temperature T as parameters. When a voltage is applied to electrodes 24, head 14 itself is also heated by the generated pseudo arc. The higher the head temperature T, the greater the reference main gas system head pressure loss $\Delta P_{HM0}$ and the reference heat gas system head pressure loss $\Delta P_{HH0}$.

Controller 18 stores data for obtaining the reference tube pressure loss $\Delta P_{TA0}$ to $\Delta P_{TD0}$, reference main gas system head pressure loss $\Delta P_{HM0}$, and reference heat gas system head pressure loss $\Delta P_{HH0}$ in the form of the above functions $f_{TA}(\ )$–$f_{TD}(\ )$, $f_{HM}(\ )$, or in the form of matrix data in which flow rates $F_A$ to $F_D$, tube length L, flow rates $F_M$, $F_H$, and head temperature T are discretely set, and based on that data, flow rates $F_{A1}$, $F_{A2}$, $F_B$ to $F_D$ of each gas actually controlled by mass flow controllers 56a1, 56a2, 56b to 56d, tube length L of attached tubes 60, and head temperature T, there obtained are reference tube pressure loss $\Delta P_{TA0}$ to $\Delta P_{TD0}$, reference main gas system head pressure loss $\Delta P_{HM0}$, and reference heat gas system head pressure loss $\Delta P_{HH0}$, those obtained in or before actually performing plasma processing, and based on those results, reference pressures $P_{A0}$ to $P_{D0}$, which are the reference gas pressures, are calculated according to the following equation: $P_{A0}=\Delta P_{TA0}+\Delta P_{HM0}$ $$P_{B0}=\Delta P_{TB0}+\Delta P_{HM0}$$

$$P_{C0}=\Delta P_{TC0}+\Delta P_{HM0}$$

$$P_{D0}=\Delta P_{TD0}+\Delta P_{HH0}$$

Incidentally, the degree of heating of head 14, that is, the head temperature T is generally depends on the current flowing when current is applied to the pair of electrodes 24, that is, the supply current I. The appropriate supply current I for the process is set as the reference supply current $I_0$. Before applying the voltage, supply current I does not flow, and if the head temperature T is considered to be the initial temperature $T_0$, which is room temperature, the head temperature T after starting voltage application increases with the amount of time elapsed time $\Delta t$ from the start of current flow when reference supply current $I_0$ flows between electrodes 24. In view of this, the above-mentioned reference main gas system head pressure loss $\Delta P_{HM0}$ and reference heat gas system head pressure loss $\Delta P_{HH0}$ are simply obtained based on the head temperature T determined by the following equation: $T=T_0+\alpha \cdot \Delta t$ $\alpha$: Coefficient Here, to simplify the explanation, the actual pressures $P_A$ to $P_D$, which are the gas pressures detected by pressure sensors 62a to 62d, and the reference pressures $P_{A0}$ to $P_{D0}$, which are the reference gas pressures, are treated as actual pressures P and reference pressures $P_0$ in a unified manner. That is, as long as there is no abnormality in the supply paths (e.g., tubes 60) for the reaction gas, the two systems' carrier gases, and the heat gas, the flow of those gases in head 14, and the generation state of the pseudo-arc and the like, since the actual pressures $P_A$ to $P_D$ exhibit similar changes to each other and the reference pressures $P_{A0}$ to $P_{D0}$ also exhibit similar changes to each other, during the period from the starting up of the plasma processing apparatus to the initiation of process by applying a voltage to electrodes 24, the actual pressures $P_A$ to $P_D$ and reference pressures $P_{A0}$ to $P_{D0}$ are treated as single values when no special distinction is required.

Figure 5:
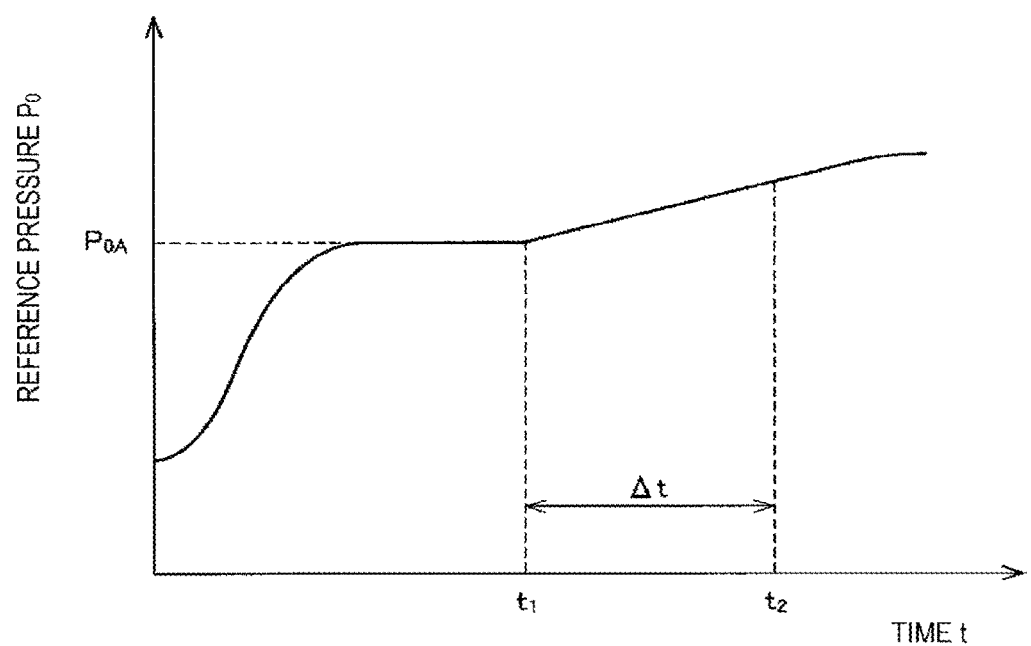
FIG. 5 A graph showing a reference change in the pressure of the gas supplied to the plasma head of FIG. 1.

When unified as described above, the change of reference pressure $P_0$ with the elapse of time t when gas of flow rate F is supplied to head 14 by adjustment of mass flow controller 56 is as shown in FIG. 5. More specifically, the starting up of the plasma processing apparatus starts the supply of gas at flow rate F and reference pressure $P_0$ increases, and at time $t_1$, reference pressure $P_0$ is saturated at $P_{04}$. Then, by initiating the application of a voltage to electrodes 24, a pseudo arc occurs in a state in which the reference supply current $I_0$ flows between electrodes 24, and along with the passage of time t, that is, with an increase in elapsed time $\Delta t$, the head temperature T gradually increases and the reference pressure $P_0$ also gradually increases. If an abnormality has not occurred in the plasma processing apparatus, that is, when the plasma processing apparatus is normal, the actual pressure P also changes along with the reference pressure $P_0$.

[D] Abnormality Detection and Allowing Initiation of Process in the Plasma Processing Apparatus In consideration of the changes in gas pressures as described above, in the present plasma processing apparatus, controller 18, which is a control device, is configured to detect abnormalities in the plasma processing apparatus and allow the plasma processing apparatus to start process based on the detected actual pressure P.

Specifically, if tube 60 is pulled out or when gas leakage has occurred in tube 60, at time $t_1$ in FIG. 5, the actual pressure P will not reach the reference pressure $P_0$. Therefore, when ($P_0$–P) exceeds a threshold pressure difference $\Delta P_1$, an abnormal decrease in pressure caused by disconnection of tube 60, gas leakage, or the like is detected. Conversely, in cases in which nozzle 30 of head 14 is clogged, a bend in tube 60 is formed, or the like, at time $t_1$, the actual pressure P exceeds the reference pressure $P_0$ to a large extent. Therefore, when (P–$P_0$) exceeds a threshold pressure difference $\Delta P_2$, an abnormal increase in pressure caused by clogging of nozzle 30, bending of tube 60, or the like is detected.

Incidentally, in the case of an abnormal decrease in pressure, the tube 60 in which an abnormality has occurred is determined depending on which of pressure sensors 62a to 62d the actual pressure does not reach the reference pressure $P_0$. Further, in the case of an abnormal increase in pressure, which tube 60 is bent, for example, is identified depending on which of the actual pressures P by detection of pressure sensors 62a to 62d exceeds the reference pressure $P_0$ to a large extent, and when all of the actual pressures P detected by each of pressure sensors 62a to 62c exceed the reference pressure $P_0$ to some extent, clogging of nozzle 30, for example, is specified to have occurred.

When an abnormal decrease in pressure or an abnormal increase in pressure has occurred, controller 18 issues a warning to the operator together with a notification regarding the nature of the abnormality. If neither an abnormal decrease in pressure nor an abnormal increase in pressure has occurred, controller 18 starts applying a predetermined voltage to electrodes 24 of head 14. That is, based on the gas pressure (i.e., a voltage pre-application gas pressure) detected by pressure sensor 62 prior to applying a voltage to electrodes 24, the present plasma processing apparatus is configured to start applying a voltage to electrodes 24 under the condition that the pre-application gas pressure has reached a set pressure ($P_0 - \Delta P_1$) and the pre-application gas pressure is lower than a set pressure that is higher than a set pressure ($P_0 + \Delta P_2$), and it is possible to detect at an early stage an abnormality in the flow of gas, more specifically, both an abnormality in the path of gas supplied from gas supply section 50 to head 14 (e.g., tube 60) and an abnormality in the path of gas in head 14 including nozzle 30. It should be noted that the plasma processing apparatus may be configured so that an abnormality in only one of these two paths is detected.

Further, head 14 is heated and the actual pressure P gradually increases when a voltage is applied to electrodes 24 and current I flows between electrodes 24, but when adequate current I (reference supply current $I_0$) due to, for example, electrodes 24 being worn or a power failure, in other words, when the discharge between electrodes 24 is not proper (i.e., arc abnormality), the actual pressure P does not increase or increases slowly with respect to the reference pressure $P_0$. Therefore, when ($P_0 - P$) exceeds a threshold pressure difference $\Delta P_3$ at time $t_2$ in FIG. 5, an arc abnormality is detected.

If an arc abnormality has occurred, controller 18 issues a warning to the operator together with a notification regarding the nature of the abnormality. If an arc abnormality has not occurred, the process is allowed to start. That is, based on the voltage post-application gas pressure, which is the gas pressure detected by pressure sensor 62 after applying a voltage to electrodes 24, the present plasma processing apparatus is configured to allow initiation of process on the condition that the post-application gas pressure has reached a set pressure ($P_0 - \Delta P_3$). Specifically, upon recognizing that the state of discharge between electrodes 24 is appropriate based on the voltage post-application gas pressure, the plasma processing apparatus is configured to allow initiation of process based on the recognition. Therefore, in the present plasma processing machine, for example, it is possible to detect an arc abnormality without depending on the current sensor for detecting current I flowing between electrodes 24 or the temperature sensor for detecting the temperature of head 14, and it is possible to more reliably detect an arc abnormality if the detection of the arc abnormality based on the detection by those sensors is performed with the detection of the arc abnormality based on the detection by pressure sensor 62. It should be noted that allowing initiation of process on the condition that the voltage post-application gas pressure reaches the set pressure ($P_0 - \Delta P_3$) can be considered equivalent to allowing initiation of process on the condition that the difference between the voltage post-application gas pressure and the voltage pre-application gas pressure reaches a set difference.

In the above technique for allowing initiation of process, allowing initiation of process was based on a voltage post-application gas pressure after the lapse of a set time $\Delta t$ ($= t_2 - t_1$) from the start of voltage application to electrodes 24, but it is also possible to adopt a technique, for example, of allowing initiation of process on the condition that the rising slope of actual pressure P after starting the voltage application to electrodes 24 is higher than a set slope, or a technique of allowing initiation of process on the condition that the time, elapsed since the application start time, at which the actual pressure P after starting the voltage application to electrodes 24 reaches a set pressure does not exceed a set time period.

[E] Sequence of Steps for Allowing Initiation of Process

Figure 6:
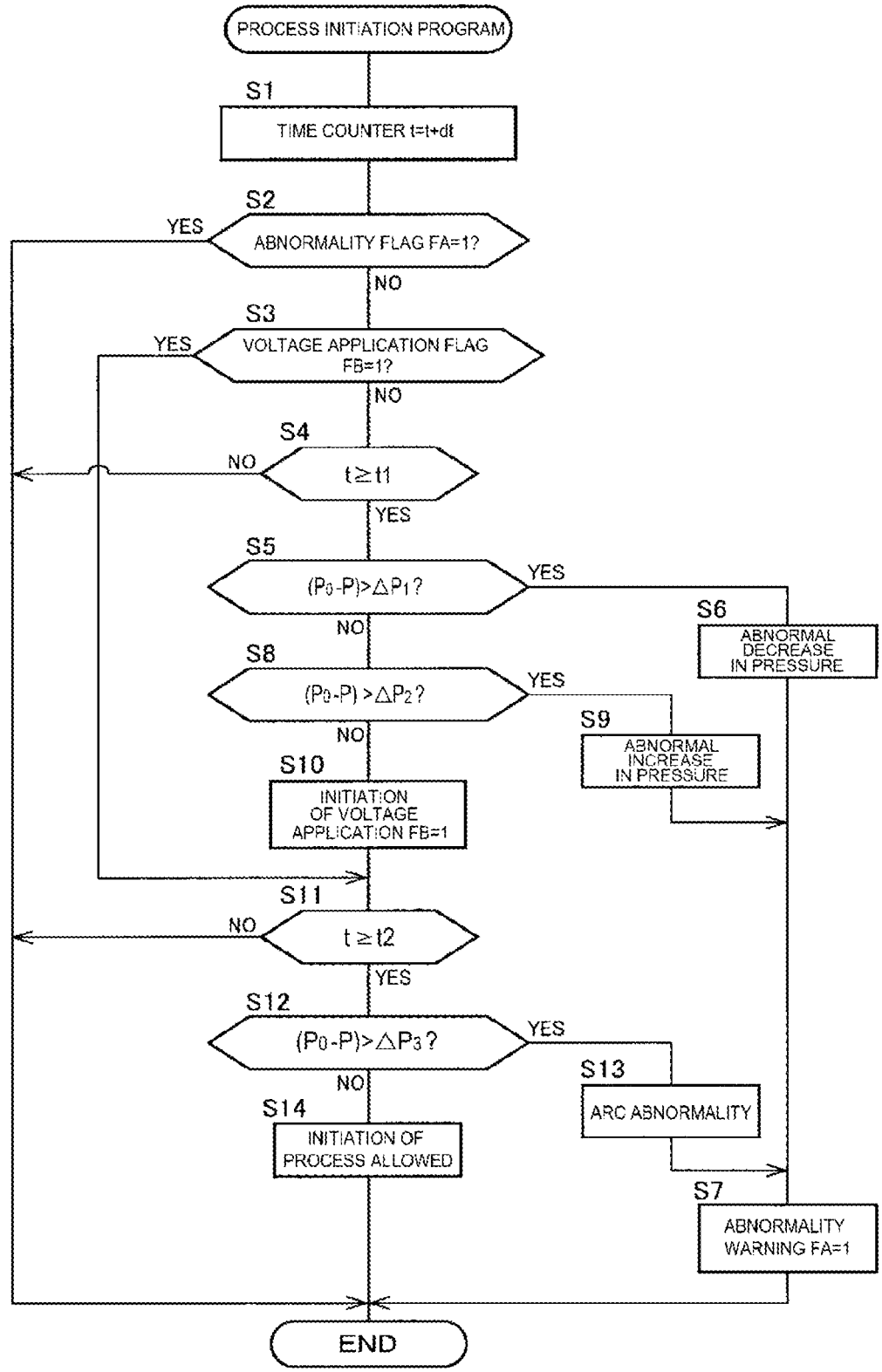
FIG. 6 A flowchart showing a process start program executed by the control device of the plasma processing apparatus of FIG. 1.

In order to allow the plasma processing apparatus to start process, controller 18 executes a process start program shown in the flowchart of FIG. 6. This program is repeatedly executed at a short time pitch from the time at which the plasma processing apparatus is operated. Hereinafter, the sequence of steps in the process of controller 18 according to the program will be described with reference to the flowchart.

First, in step 1 (hereinafter, abbreviated as "S1" and likewise for the other steps), the count value t of the time counter is counted up. This count value t is set to 0 at the first execution of the program. In the subsequent step S2, it is determined whether the value of an abnormality flag FA is "1". The abnormality flag FA is a flag set to "1" when any one of an abnormal decrease in pressure, an abnormal increase in pressure, and an arc abnormality is identified, and the flag value is set to "0" at the time of the first execution of the program. If an abnormality has already been identified, the following steps are skipped.

If an abnormality has not yet been identified, in the next step S3, it is determined whether the value of a voltage application flag FB is "1". The voltage application flag FB is a flag set to "1" when a voltage has already been applied between electrodes 24, and the flag value is set to "0" at the time of the first execution of the program. If a voltage has not yet been applied, it is determined whether the set time $t_1$ has elapsed from the start of operation of the plasma processing apparatus based on the count value t of the time counter in S4 which follows. If the set time $t_1$ has not elapsed, one execution of the program is terminated.

When it is determined in S4 that the set time $t_1$ has elapsed, it is determined in S5 whether the value obtained by subtracting the actual pressure P from the reference pressure $P_0$, at the count value t of the time counter, exceeds the threshold pressure difference $\Delta P_1$, and if it exceeds the threshold pressure difference $\Delta P_1$, it is determined in S6 that an abnormal decrease in pressure has occurred, and in S7, a warning that an abnormal decrease in pressure has occurred is issued and the abnormality flag FA is set to "1".

If the value obtained by subtracting the actual pressure P from the reference pressure $P_0$ in S5 is equal to or less than the threshold pressure difference $\Delta P_1$, in the subsequent step S8, it is determined whether the value obtained by subtracting the reference pressure $P_0$ from the actual pressure P exceeds the threshold pressure difference $\Delta P_2$, and if it exceeds the threshold pressure difference $\Delta P_2$, it is determined in S9 that an abnormal increase in pressure described above has occurred, and in S7, a warning that an abnormal increase in pressure has occurred is issued and the abnormality flag FA is set to "1".

If it is determined in S8 that the value obtained by subtracting the reference pressure $P_0$ from the actual pressure P is equal to or less than the threshold pressure difference $\Delta P_2$, the application of voltage to electrodes 24 is started in S10 and a pseudo arc is generated between electrodes 24. The value of the voltage application flag FB is then set to "1".

After starting the voltage application, that is, if it is determined in S3 that the voltage is already applied to electrodes 24, the steps S4 and onward are skipped, and it is determined in S11 whether the set time $t_2$ has elapsed from the start of operation of the plasma processing apparatus based on the count value t of the time counter, that is, whether the above-mentioned elapsed time $\Delta t$ has elapsed since the voltage was applied. If the set time $t_2$ has not elapsed, one execution of the program is terminated.

If it is determined that the set time $t_2$ has elapsed in S11, it is determined in S12 whether the value obtained by subtracting the actual pressure P from the reference pressure $P_0$, at the count value t of the time counter, exceeds the threshold pressure difference $\Delta P_3$, and if it exceeds the threshold pressure difference $\Delta P_3$, it is determined in S13 that an arc abnormality described above has occurred, and in S7, a warning that an arc abnormality has occurred is issued and the abnormality flag FA is set to "1".

When the value obtained by subtracting the actual pressure P from the reference pressure $P_0$ is equal to or less than the threshold pressure difference $\Delta P_3$ in S12, the plasma processing apparatus is allowed to start plasma process on the workpiece in S14. When this allowance is granted, repetition of program execution is terminated. Although the process according to the program is executed when the plasma processing apparatus is in operation, the process may be executed each time plasma process for one workpiece is completed and plasma process for the next workpiece is to be started.

REFERENCE SIGNS LIST

14: Plasma head, 16: power supply and gas supply unit, 18: controller [control device], 24: electrode, 30: nozzle, 50: gas supply section [gas supply device], 60: gas tube, 62: pressure sensor [pressure detector], P: actual pressure, $P_0$: reference pressure

The invention claimed is:

1. A plasma processing apparatus, configured to perform process using a plasma-converted gas, comprising:
a plasma head configured to convert gas into plasma between electrodes to which a voltage is applied and discharge the plasma-converted gas from a nozzle;
a gas supply device configured to supply gas including gas to be converted into plasma to the plasma head;
a pressure detector configured to detect the pressure of the gas supplied from the gas supply device; and
a controller configured to control the plasma processing apparatus,
wherein the controller is configured to allow initiation of process based on a voltage post-application gas pressure, which is the gas pressure detected by the pressure detector after starting voltage application to the electrodes, and
wherein the controller is configured to recognize whether a state of discharge between the electrodes is appropriate based on the voltage post-application gas pressure and allow initiation of process based on the recognition.

2. The plasma processing apparatus of claim 1, wherein the controller is configured to allow initiation of process on the condition that the voltage post-application gas pressure reaches a set pressure.

3. A plasma processing apparatus, configured to perform process using a plasma-converted gas, comprising:
a plasma head configured to convert gas into plasma between electrodes to which a voltage is applied and discharge the plasma-converted gas from a nozzle;
a gas supply device configured to supply gas including gas to be converted into plasma to the plasma head;
a pressure detector configured to detect the pressure of the gas supplied from the gas supply device; and
a controller configured to control the plasma processing apparatus,
wherein the controller is configured to allow initiation of process based on a voltage post-application gas pressure, which is the gas pressure detected by the pressure detector after starting voltage application to the electrodes, and
wherein the controller is configured to allow initiation of process based on the voltage post-application gas pressure after a set time has elapsed from the starting of the voltage application to the electrodes.

4. A plasma processing apparatus, configured to perform process using a plasma-converted gas, comprising:
a plasma head configured to convert gas into plasma between electrodes to which a voltage is applied and discharge the plasma-converted gas from a nozzle;
a gas supply device configured to supply gas including gas to be converted into plasma to the plasma head;
a pressure detector configured to detect the pressure of the gas supplied from the gas supply device; and
a controller configured to control the plasma processing apparatus,
wherein the controller is configured to allow initiation of process based on a voltage post-application gas pressure, which is the gas pressure detected by the pressure detector after starting voltage application to the electrodes, and
wherein the controller is further configured to initiate application of a voltage to the electrodes based on a voltage pre-application gas pressure, which is the gas pressure detected by the pressure detector prior to applying a voltage to the electrodes.

5. The plasma processing apparatus of claim 4, wherein the controller is configured to allow initiation of process on the condition that a difference between the voltage post-application gas pressure and the voltage pre-application gas pressure reaches a set difference.

6. The plasma processing apparatus of claim 5, wherein the controller is configured to detect an abnormality in at least one of a path of gas supplied from the gas supply device to the plasma head and a path of gas in the plasma head including the nozzle based on the voltage pre-application gas pressure.

7. The plasma processing apparatus of claim 4, wherein the controller is configured to detect an abnormality in at least one of a path of gas supplied from the gas supply device to the plasma head and a path of gas in the plasma head including the nozzle based on the voltage pre-application gas pressure.

* * * * *